United States Patent [19]
Kashiwagi et al.

[11] Patent Number: 5,829,989
[45] Date of Patent: Nov. 3, 1998

[54] IC SOCKET

[75] Inventors: Tsutomu Kashiwagi, Kawaguchi; Tetsuo Tachihara, Hatogaya, both of Japan

[73] Assignee: Enplas Corporation, Kawaguchi, Japan

[21] Appl. No.: 811,884

[22] Filed: Mar. 5, 1997

[30]     Foreign Application Priority Data

Mar. 6, 1996  [JP]  Japan ................................... 8-049008
Mar. 11, 1996 [JP]  Japan ................................... 8-053197

[51] Int. Cl.$^6$ ....................................................... H01R 9/09
[52] U.S. Cl. ............................................. 439/71; 439/266
[58] Field of Search ................................ 439/70, 71, 72, 439/73, 236, 266, 525, 526

[56]                References Cited

U.S. PATENT DOCUMENTS 4,691,975  9/1987  Fukunaga et al. .
5,009,609  4/1991  Matsuoka et al. .
5,348,483  9/1994  Sagano .

*Primary Examiner*—Khiem Nguyen
*Attorney, Agent, or Firm*—Cushman Darby & Cushman IP Group of Pillsbury Madison & Sutro LLP

[57]               ABSTRACT

An IC socket has a guide onto at least one of opposite corners, and the guide is provided with a vertical face portion of such a height that it is capable or coming in contact with one of the leads of an IC package loaded and accurately restricting the position where the IC package is loaded. Instead or some of a plurality of contact pins arranged along the sides of a rectangular base member, a guide member removably mounted to the base member is provided. BY this guide member, a region smaller in size than a normal region can be defined on the base member, and the IC socket capable of loading IC packages or different sizes is provided.

13 Claims, 6 Drawing Sheets

IC SOCKET

BACKGROUND OF THE INVENTION

1. Field of the Invention

This invention relates to an IC socket for use in the mounting and circuit testing of an IC package.

2. Description of the Related Art

FIGS. 1 and 2 show structural outlines of a conventional IC socket. FIG. 1 is a plan view of the IC socket. FIG. 2 is a sectional view taken along line II—II in FIG. 1.

The IC socket, as shown in FIG. 2, includes a rectangular base member 1 and a rectangular frame-shaped cover member 2 which is movable in a vertical direction with respect to the base member 1. A square pillar-shaped leg 2a, extending downwardly from the lower side of the cover member 2, slides along a guide groove 1a provided at a corresponding position of the base member 1 so that the cover member 2 can be moved up and down in regard to the base member 1. A spring 3 is interposed between the base member 1 and the cover member 2, and, as shown in FIG. 2 resilient forces of the spring 3 and contact pins 5 described later, allow the cover member 2 to be located above the base member 1. In this way, the cover member is held at the position shown in FIG. 2 by locking means, not shown, placed between the leg 2a and the guide groove 1a.

The cover member 2, is shown in FIG. 1, is provided with a plurality of insulating ribs 4 arranged at equal intervals along opposite sides and a plurality of contact pins 5, each of which is inserted between adjacent insulating ribs 4.

Each of the contact pins 5 is constructed or metal or other conductive material, and as shown in FIG. 2, includes a contact portion 5a coming in contact with each of leads L of an IC package P mounted on a mounting base 6 of the base member 1; a working portion 5b for turning the contact portion 5a in accordance with the vertical movement of the cover member 2; a spring portion 5c bent into an arc form to provide resilience to the entire contact pin 5; a base portion 5d seated in a cavity inside the base member 1; connecting terminals 5e inserted in through-holes piercing the bottom of the base member 1 to support the contact pin 5 on the base member 1.

The working portion 5b of each contact pin 5 is positioned so as to engage a cam portion 2b configured on an opposite periphery of the cover member 2. When the cover member 2, as depicted in FIG. 2, is located above the base member 1, the working portion 5b does not come in contact with the cam portion 2b, while when the cover member 2 is pressed downwardly, the working portion 5b is engaged with the cam portion 2b and is turned to a position indicated by a chain line in FIG. 2. In keeping with the turning of the working portion 5b, the contact portion 5a is also turned to a position indicated by a corresponding chain line so that it separates from the lead L of the IC package P.

At the four corners of the mounting base 6, guides 7 are respectively provided, each of which has a vertical face portion 7a (which will be described later) opposite to each line formed by the contact pins 5. The leads L of the IC package P to be mounted on the mounting base 6 are guided along the vertical face portions 7a of the guides 7 and are mounted on the mounting base 6 in a state where they are positioned with respect to the mounting base 6.

The IC socket constructed as mentioned above is used as follows: The cover member 2 is first pressed down to the lowest level against the resilient force of the spring 3. When the cover member 2 is pressed down, the working portion 5b of the contact pin 5 is turned to the position indicated by the chain line by the cain portion 2b of the cover member 2 engaged with the working portion 5b of the contact pin 5. In keeping with this, the contact portion 5a is also turned to the position indicated by the chain line to separate from the mounting base 6.

In this state, the IC package P, for example, for circuit testing is mounted on the mounting base 6 of the base member 1. At this time, the IC package P is placed so that each lead L of the IC package P is located on the underside of the contact portion 5a turned outwardly.

After the IC package P is mounted, a force exerted to press the cover member 2 downwardly is weakened, and the cover member 2 is moved upwardly by the resilient forces of the spring 3 and the contact pins 5. In accordance with this operation, the contact portion 5a of each contact pin 5 is shifted from the position indicated by the chain line toward a position by a solid line.

When the cover member 2 is moved to the highest level, the working portion 5b of the contact pin 5 is disengaged from the cam portion 2b of the cover member 2, and thus the contact portion 5a of the contact pin 5 is returned to the position indicated by the solid line. This brings about a state where each lead 1, of the IC package P is sandwiched between the contact portion 5a of the contact pin 5 and the mounting base 6.

Subsequently, a voltage is applied to the IC package P from a proper test circuit (not shown) through the connecting terminals 5e and the lead L, and a test is made as to whether the IC package P satisfies predetermined working conditions. After the test is completed, the above operations for pressing the cover member 2 and releasing the pressure therefrom are repeated, and the IC package P is taken out of the IC socket. In this way, one cycle of the circuit testing is completed.

By repeating the cycle of this circuit testing, the qualities of many IC packages P are determined.

An actual test for using the IC socket to determine the qualities of the IC packages is conducted by an automatic tester. This automatic tester is capable of automatically repeating the process that the cover member 2 is pressed down automatically, the IC package is mounted at a predetermined position, and after the circuit testing is completed, the cover member 2 is again pressed down, a tested IC package P is taken out, and a new IC package is mounted.

In manual operation, on the other hand, the method of mounting the IC package on the mounting base 6 while pressing down the cover member 2 causes a decrease in work efficiency. Thus, it is a general practice to mount the IC package as described below.

First, as shown in FIG. 3, the IC package P is placed on the contact pins 5, with the contact pins 5 coming in contact with an IC mounting face 6a of the mounting base 6. After that, the cover member 2 is pressed down to turn the contact pins 5 outwardly so that the IC package P placed on the contact pins 5 is dropped and seated on the mounting base 6. Subsequently, the downward pressure of the cover member 2 is released, the cover member 2 is returned to the highest level, the contact pins 5 are turned to the normal position, and the contact portions 5a of the contact pins 5 are brought into contact with tile leads L of the IC package P.

In this case, however, if a height h of the vertical face portion 7a of the guide 7 conducting the leads L so that the IC package P is seated at the normal position of the mounting base 6 is insufficient, cases may arise in which the function of properly conducting the leads L is not performed. Specifically, as shown in FIG. 3, if A>h where A is a height from the mounting face 6a of the mounting base 6 to the upper face of the lead L placed on each contact pin 5, the leads L cannot be completely conducted by the vertical face portion 7a of the guide 7. For this reason, cases may occur in which the IC package P is moved from the normal position in a horizontal direction, and the contact pins 5 and the leads L interfere with one another. If the contact pins 5 are turned outwardly in this state, the leads L may be deformed.

For the conventional IC socket mentioned above, the IC package P is mounted in a region S (indicated by broken hatching lines in FIG. 1) surrounded by an array of the insulating ribs 4 and the contact pins 5. In one IC socket, since a space for the insulating rib 4 and the contact pin 5 which are adjacent to each other and a corresponding space on the opposite side are constant, the region S is uniquely determined. Thus, in the conventional IC socket, the IC package whose circuit can be tested by this IC socket is limited to an IC package body (excluding the leads) having a size which coincides with that of the region S formed by the IC socket.

In recent years, however, IC packages various In sizes have come into use. Consequently, it is very costly to prepare an IC socket in accordance with the size of the IC package, and if the IC socket must be replaced each time the size of the IC package varies, test efficiency cannot be improved.

SUMMARY OF THE INVENTION

It is, therefore, a primary object of the present invention to provide an IC socket in which the IC package, even when mounted on the contact pins before the contact pins are turned, can be accurately guided to a predetermined position.

Another object of the present invention is to provide an IC socket in which IC packages of different sizes can be tested by a single IC socket.

In order to achieve the first object, the IC socket according to the present invention includes a mounting base on which the IC package is mounted; a cover member attached to a base member to be movable in a vertical direction of the mounting base; a plurality of contact pins arranged along opposite sides of the mounting base so that contact portions thereof are turned in accordance with the vertical movement of the cover member to come in contact with leads of the IC package mounted on the mounting base; and guides provided at two or four corners along the diagonal lines of the mounting base to position the IC package mounted on the mounting base. A vertical face portion of each of the guides which conducts the Leads of the IC package to be mounted on the mounting base extends in a direction normal to an IC mounting face of the mounting base, and when each contact pin comes in contact with the mounting face, the height of the vertical face portion is selected above a height from the mounting face when each lead of the IC package is placed on the contact pin to the upper face of the lead.

The vertical face portions of the guides may be configured, one for each guide, or two for each guide to make at right angles with each other.

In order to achieve the second object, the IC socket of the present invention is equipped with guides, in place of predetermined contact pins, between a plurality of insulating ribs for supporting the contact pins arranged at equal intervals along opposite sides to restrict the positions of insertion of IC packages of various dimensions to be mounted.

According to the present invention, each of the guides is preferably shaped into a plate-like form, and one or more guides are used.

Further, the IC socket of the present invention includes a plurality of insulating ribs arranged at equal intervals along four sides of a rectangle; a plurality of contact pins, each of which is inserted between adjacent insulating ribs; guide members provided at corners made by the four sides, for restricting the positions of corner portions of the IC package; and at least one pair of guides for restricting the position of the insertion of the IC package in the IC socket, mounted, in place of predetermined contact pins, between the insulating ribs arranged along sides adjacent to at least one pair of guide members.

Still further, the IC socket of the present invention includes a floating member having a plurality of contact-pin inserting holes bored at equal intervals along four sides of a rectangle, mounted on the base member to be movable in a vertical direction thereof; a plurality of contact pins implanted in the base member so that connecting terminals thereof are inserted in the contact-pin inserting holes; and at least one pair of guides removably fitted, in place of predetermined contact pins, in the contact-pin inserting holes, for restricting the positions of corner portions of the IC package to be mounted.

Furthermore, according to the present invention, each of the guides has a cavity of such a shape that it is capable of engaging with each corner portion of the IC package.

According to the present invention, the IC socket can be provided in which the IC package is always accurately loaded at a prede termined position of the IC socket and IC packages of various sizes are loaded.

Other objects, features, and advantages of the present invention will become apparent from the following description of the preferred embodiments when taken in conjunction with the accompanying drawings.

DETAILED DESCRIPTION OF THE PREFERRED EMBODIMENTS

Figure 3:
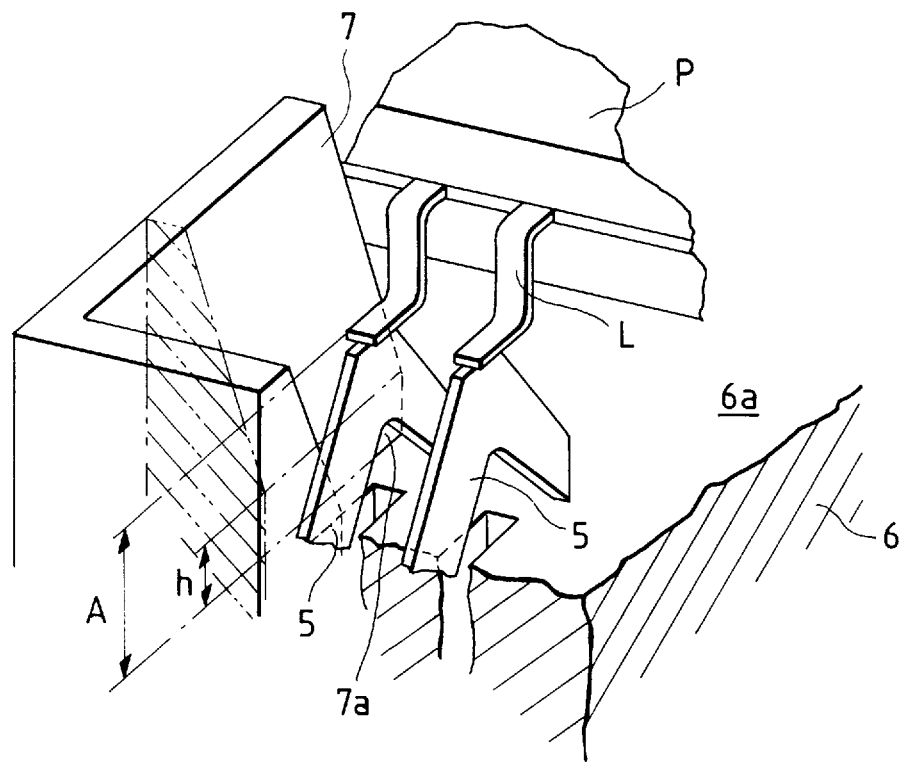
FIG. 3 is a partially enlarged perspective view of the IC socket in FIG. 2.
Figure 4A:
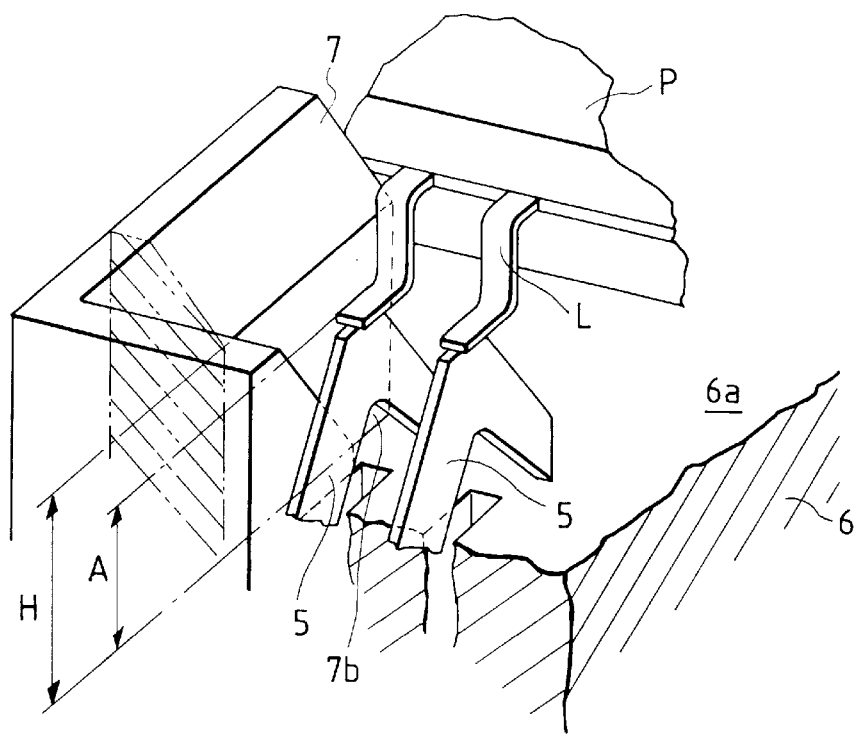
FIG. 4A is a partially enlarged perspective view showing a first embodiment of an IC socket according to the present invention.
Figure 4B:
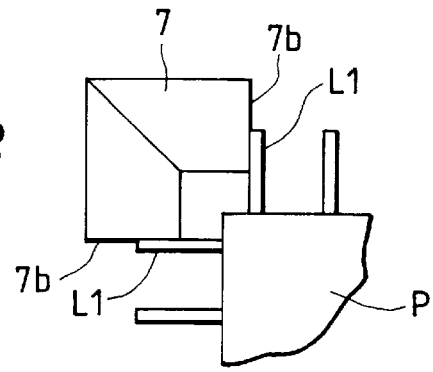
FIG. 4B is a partially enlarged plan view showing a second embodiment of the IC socket according to the present invention.
Figure 4C:
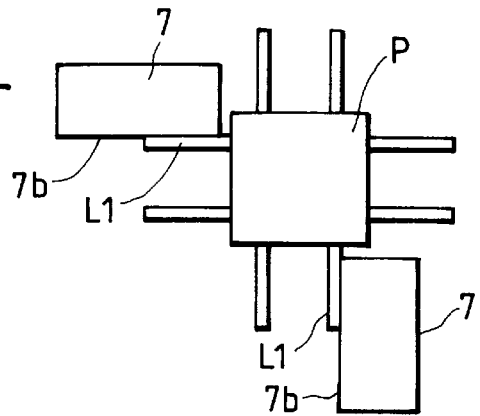
FIG. 4C is a partially enlarged plan view showing a third embodiment of the IC socket according to the present invention.

FIGS. 4A, 4B, and 4C show embodiments different from one another, of the IC socket according to the present invention. In these figures, like numerals indicate substantially like members and parts shown in FIGS. 1–3.

Figure 1:
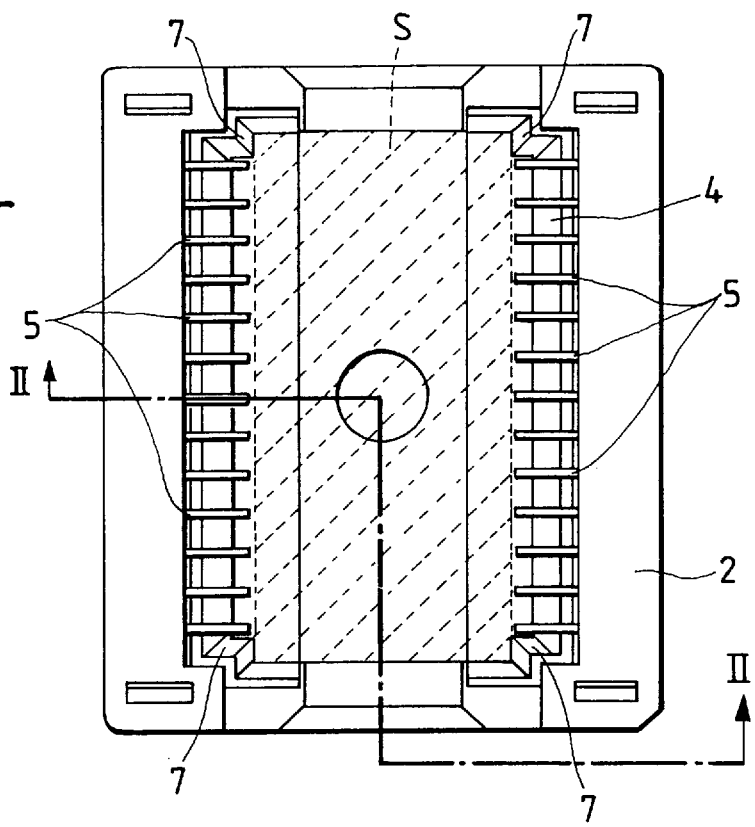
FIG. 1 is a plan view showing an example of a conventional IC socket.
Figure 2:
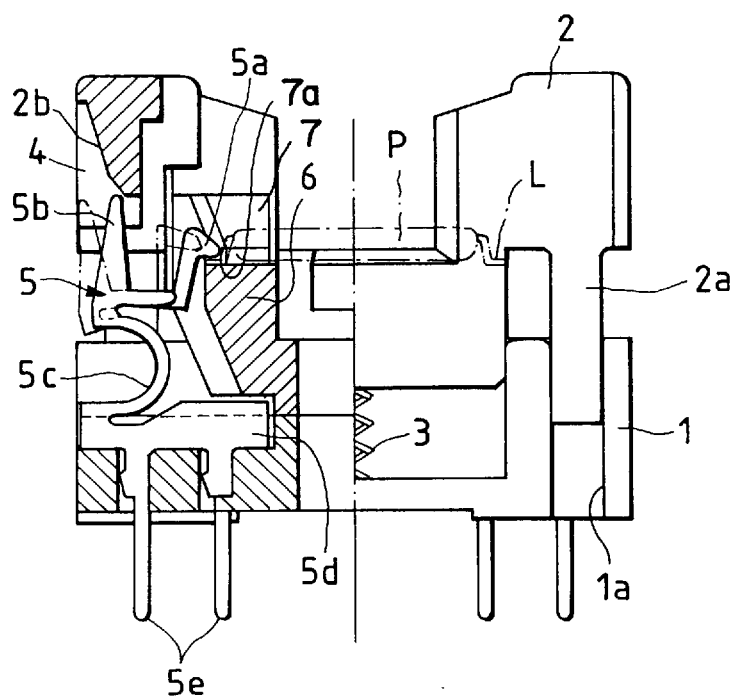
FIG. 2 is a sectional view taken along line II—II in FIG. 1.

Any of these embodiments has the same structure as the conventional IC socket shown in FIGS. 1 and 2 with the exception of the structure of each guide, and thus the description of the entire structure is omitted here.

FIG, 4A shows the first embodiment of the present invention. In this embodiment, each guide 7 has a vertical face portion 7b of a height H that satisfies the following condition with respect to the height A from the mounting face 6a of the mounting base 6 to the upper face of the lead L placed on each contact pin 5:

H>A

Thus, even though the leads L of the IC package P are placed on the contact pins 5 before the contact pins 5 are turned outwardly, that is, the cover member 2 is pressed down, the vertical face portion 7b of the guide 7, because its height is above that from the mounting face 6a to the upper face of the leads L, serves to fully perform the function of guiding the leads L, without shifting the leads L horizontally before the contact pins 5 are turned outwardly.

The vertical face portions 7b of the guides 7 can be configured, one or two for each guide. FIG. 4B shows the structure of the second embodiment where each guide 7 is provided with two vertical face portions 7b. Each of the vertical face portions 7b contacts with a lead L1 located at the end of a lead array of the IC package P to guide the lead $L_1$ so that the IC package P can be seated at a predetermined position on the mounting base 6.

FIG. 4C shows the structure of the third embodiment where each guide 7 is provided with one vertical face portion 7b. In this embodiment, two guides 7 are provided along the diagonal line of the IC socket, each having one vertical face portion 7b. The vertical face portion 7b contacts with the lead L1 located at the end of the lead array of the IC package P to guide the lead $L_1$ so that the IC package P can be seated at a predetermined position on the mounting base 6.

In this way, the guides 7 need not necessarily be placed onto all the four corners of the mounting base 6, and the vertical face portions 7b of the guides 7 need not necessarily be provided onto the four corners accordingly. When the guides 7 and the vertical face portions 7b thereof are provided onto at least two of the four corners of the mounting base 6, it is possible to conduct the IC package P to a predetermined position.

Figure 5:
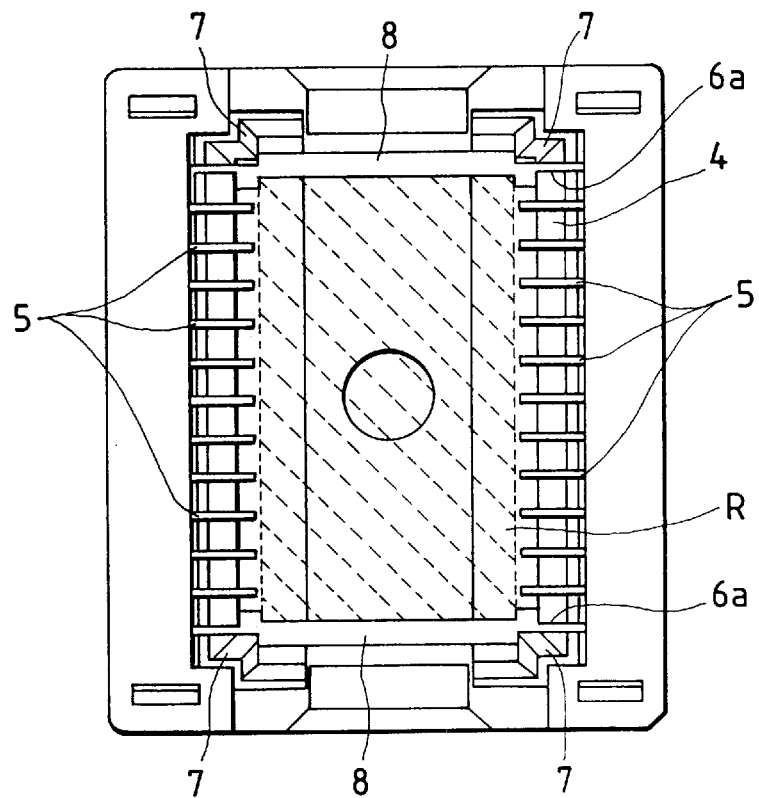
FIG. 5 is a plan view showing a fourth embodiment of the IC socket according to the present invention.
Figure 6:
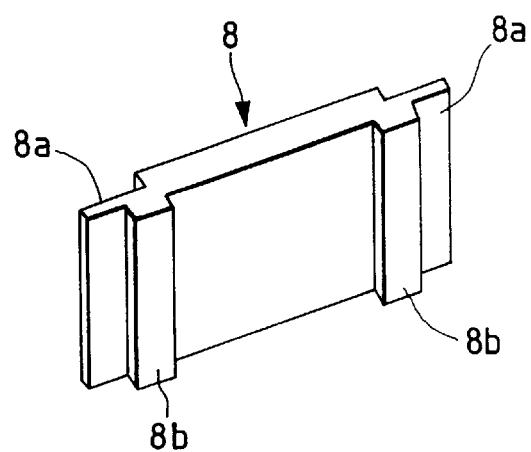
FIG. 6 is a perspective view showing a guide used in the fourth embodiment.

FIGS. 5 and 6 illustrate the fourth embodiment of the present invention. In this embodiment, of the plurality of contact pins 5 individually inserted between the plurality of insulating ribs 4 arranged at regular intervals along opposite sides, the contact pins 5 located at the ends of both sides are not inserted to provide spaces 6a.

A plate-shaped guide 8 such as that shown in FIG. 6 is inserted in each pair of spaces 6a. The guide 8 assumes such a shape that its ends 8a can be inserted in the spaces 6a. By inserting the guides 8 in the spaces 6a, as shown in FIG. 5, a region R (indicated by broken hatching lines) is formed which is surrounded by a pair of guides 8 and an array of the plurality of contact pins 5. In this case, the position of each plate-shaped guide 8 is shifted or the thickness thereof is properly chosen, and thereby vertical plane faces 8b can be used as the guide faces of the leads L so that the IC package P is accurately seated at the predetermined position on the mounting base 6. Although each guide 8 can be freely removed from the spaces 6a, it may be fixed to the base member 1 with an adhesive when necessary.

In this way, it becomes possible to test the performance of the IC package P having a package body which can be incorporated in the region R. Thus, in the conventional IC socket shown in FIGS. 1 and 2, only the IC package having the size governed by the region S can be tested. In the IC socket of the fourth embodiment, by contrast, the guides 8 are provided in the holes in which the contact pins 5 are not inserted, namely the spaces 6a, and the positions or shapes of the guides 8 are changed according to the size of the IC package, so that if the IC package is smaller than the region S, IC packages various in size can be tested by a single IC socket.

Also, the pair of guides 8 need not necessarily be used, and a single guide 8 can be used to define the regions R of various sizes which are smaller than the region S.

Figure 7:
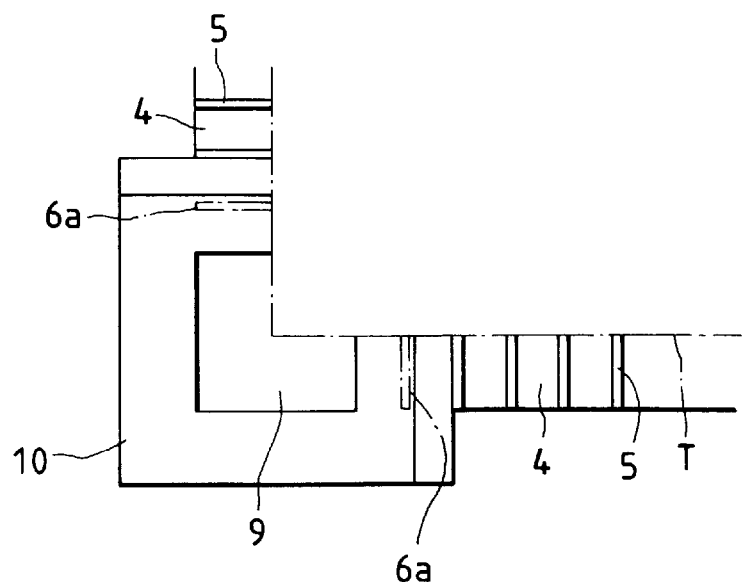
FIG. 7 is a partially enlarged plan view showing a fifth embodiment of the IC socket according to the present invention.

FIG. 7 depicts the fifth embodiment of the present invention. The IC socket of this embodiment, unlike that of the fourth embodiment, is such that the plurality of insulating ribs 4 are arranged at regular intervals along four sides of the rectangle, and the contact pins 5 are individually inserted between the adjacent insulating ribs 4 (In this figure, only one of the corners of the rectangular IC socket is shown). Moreover, a guide member 9 for restricting the position of each corner portion of the IC package is provided at each corner of the IC socket.

In the IC socket of the fifth embodiment, as in the fourth embodiment, the contact pins 5 located at the ends of each side, of the plurality of contact pins 5 arranged along the side, are removed to provide the spaces 6a.

Figure 8:
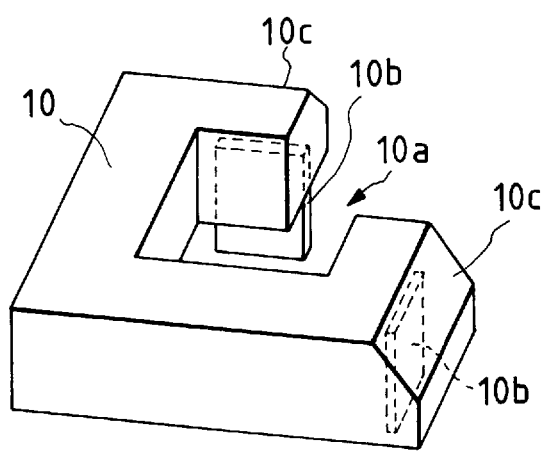
FIG. 8 is an enlarged perspective view showing a guide used in the fifth embodiment.

In the IC socket of the fifth embodiment, a guide 10 such as that shown in FIG. 8 is mounted outside the guide member 9 provided at each of the four corners of the IC socket. The guide 10 is shaped like the letter "C" and has a cavity 10a of such a shape that it can be engaged with each corner portion of the IC package loaded on the IC socket. Furthermore, two projections 10b are configured on the bottom of the guide 10. The projections 10b are shaped to fit into the spaces 6a and located at the positions corresponding to the spaces 6a. The guide 10 can be removed from the spaces 6a.

Additionally, as shown in FIG. 7, the guide 10 has such a shape that it does not interfere with the guide member 9 when the projections 10b are inserted in the spaces 6a to attach the guide 10 to each corner portion of the IC socket.

The four guide members 9 provided at the corners of the IC socket form a region T of the IC package with all the leads including endmost leads indicated by chain Lines. Thus, in the absence or the guides 10, the IC package of such a size that it can be incorporated in the region T of the IC package with all the leads can be mounted to the IC socket so that the circuit of this IC package is tested.

In contrast to this, when the guides 10 are mounted to the corners of the IC socket, the four guides 10 can accommodate the IC package devoid of the leads at the ends of the sides (namely, the leads located at the positions indicated by chain lines in FIG.7) although the IC package is the same in size as the region T. When the guides 10 are thus mounted, the IC package devoid of the leads at the ends of the sides can be properly loaded on the IC socket, and the circuit of this IC package can be tested. In this case, a vertical face portion 10c serves as the guide face of the lead L, and hence the IC package P can be accurately seated at the predetermined position on the mounting base 6.

In the IC socket of the fifth embodiment, as mentioned above, it becomes possible to test the circuits of IC packages of two kinds of sizes according to the possible mounting of the guides 10.

Also, although in the fifth embodiment the contact pins 5 located at the ends of the sides are removed to provide the spaces 6, the contact pins 5 to be removed are not limited to those at the ends. In accordance with the shapes of the leads of the IC package to be tested, the contact pins 5 to be removed are chosen and the predetermined spaces 6a can be provided. The guides 10 of such sizes that they can accommodate the spaces 6 thus available are previously made, and thereby the IC packages of the leads various in shape can be tested by a single IC socket.

The guides 10 need not necessarily be mounted at all the corners of the IC socket. For example, two guides may be mounted along the diagonal line or at the ends of one side.

Figure 9:
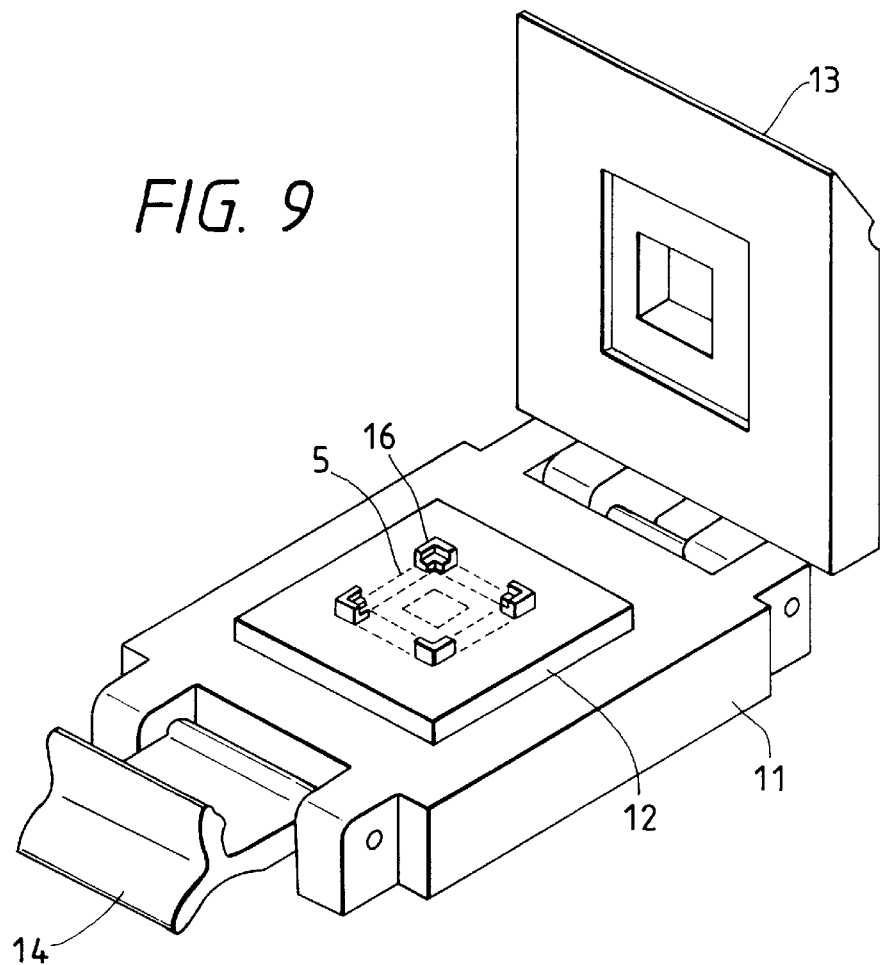
FIG. 9 is a perspective view showing a sixth embodiment of the IC socket according to the present invention.
Figure 10:
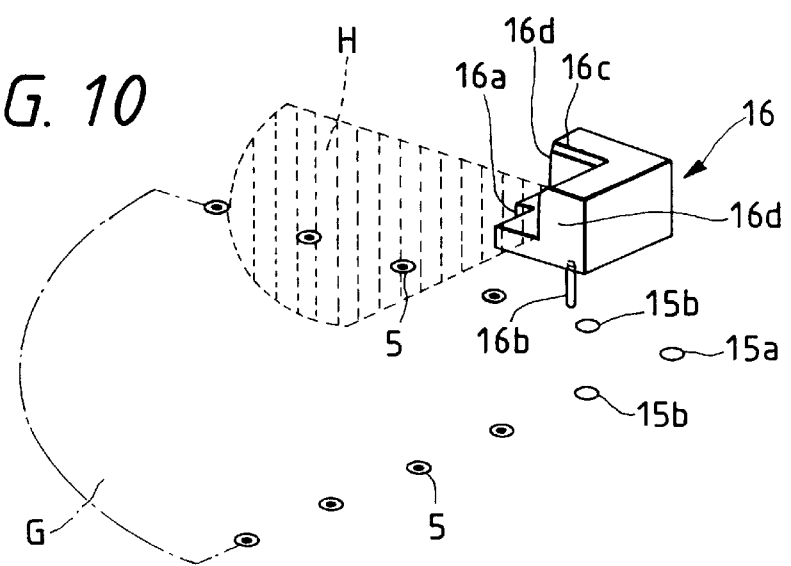
FIG. 10 is a perspective view showing a guide used in the sixth embodiment.

The sixth embodiment of the present invention is shown in FIGS. 9 and 10. The IC socket of this embodiment is equipped with a base member 11 and a floating member 12 supported by the base member 11 to be movable in a vertical direction of the base member 11. At one end of the base member 11, a cover member 13 is hingedly mounted so that it can be freely opened and closed with respect to the base member 11. At the other end of the base member 11, a lock lever 14 is hingedly mounted and engaged with the top end of the cover member 13 so that the cover member 13 is held in a closed state.

On the surface of the floating member 12, a plurality of contact-pin inserting holes arranged at equal intervals along the four sides of a rectangle are provided, in which pin probes for the contact pins 5 are implanted. End contact portions of the contact pins 5 inserted in the contact-pin inserting holes are arranged so that when the floating member 12 is pushed, they can be exposed to the surface thereof. These exposed contact portions of the contact pins 5 come in contact with the land contacts or the leads L of the IC package mounted on the floating member 12.

As shown in FIG. 10, the contact pins 5 are not inserted in a hole 15a located at a corner and a pair of holes 15b adjacent thereto, of the contact-pin inserting holes arranged in a rectangular form, to provide spaces.

A guide 16 such as that shown in FIG. 10 is attached to the three contact-pin inserting holes 15a and 15b which form the spaces. The guide 16 is composed of a block of V-shaped cross section and has a cavity 16c of such a shape that it can be engaged with the corner portion of the IC package, for example, of a BGA (ball grid array) type, to be mounted on the floating member 12. Moreover, two projections 16b of such sizes that they can be inserted in the contact-pin inserting holes 15b extend from the bottom of the guide 16. These two projections 16b are provided at the positions where they can be inserted in a pair of contact-pin inserting holes 15b.

The contact pins 5 arranged in the rectangular form shapes a region G indicated by a chain line. Thus, in the absence of the guides 16, the IC package of such a size that it can be incorporated in the region G is mounted on the floating member 12 and can be tested.

In contrast to this, when the guides 16 are mounted onto the corners of the IC socket, a region if (indicated by broken hatching lines) smaller than the region G is shaped by the four guides 16. When the guides 16 are thus mounted, the IC package of such a size that it can be incorporated in the region H is mounted to the IC socket, and the circuit of this IC package can be tested. In this case, where the IC package with gull-wing leads is available, vertical face portions 16d of the guide 16 can be made to serve as the guide faces of the leads L.

Thus, in the IC socket of the sixth embodiment, as in the fifth embodiment, it becomes possible to test the circuits of the IC packages of two kinds of sizes in accordance with the possible mounting of the guides 16.

Also, although in the sixth embodiment the contact pins 5 are not inserted in the hole 15a located at the corner and the holes 15b adjacent thereto, of the contact-pin inserting holes provided in the rectangular form, to provide the spaces, the place where the spaces are formed is not limited to this case. In accordance with the size of the IC package to be tested, the place where the contact pins 5 are not inserted is arbitrarily chosen to form the spaces, and the guide 16 of such a size that it can accommodate the spaces thus available is previously made. By doing so, IC packages of various sizes can be tested by a single IC socket.

The guides 16 need not necessarily be mounted onto all the corners of the IC socket. If the guides 16 are mounted onto at least two of the four corners of the IC socket, the region H can be defined. The guides 16 may be mounted, for example, along the diagonal line or at the ends of one side.

Although the sixth embodiment has been described for use in the testing of the IC package, it is needless to say that the IC socket can also be used for the mounting of the IC package.

What is claimed is:

1. An IC socket comprising:

a rectangular base member having a mounting face portion for mounting a plurality of leads of an IC package thereon;

a plurality of insulating ribs arranged at regular intervals on said base member along opposite sides thereof;

a plurality of contact pins, each contact pin being inserted between adjacent two insulating ribs of said plurality of insulating ribs, each contact pin having a contact portion and a portion adiacent the contact portion which overlap said mounting face portion, as viewed from above said mounting face portion, when said contact pin is in a free condition; and guides for restricting a position where the IC package is mounted on said base member;

wherein said guides are equipped with vertical plane faces for guiding a plurality of leads of the IC package, and said IC socket is constructed so that when the IC package is inserted in said IC socket with the plurality of leads thereof temporarily supported on said plurality of contact pins, a height of each of said vertical plane faces is higher than a height from said mounting face portion of said base member to an upper face of each of the plurality of leads of the IC package temporarily supported on said plurality of contact pins, whereby when said plurality of contact pins are urged to withdraw from said mounting face portion, the plurality of leads are guided downward to be set in place on said mounting face portion while side faces of leads positioned at ends of rows of the plurality of leads are guided by said vertical plane faces.

2. An IC socket according to claim 1, wherein said vertical plane faces are configured, at most, two for each of said guides, opposite to sides along which said plurality of contact pins are arranged.

3. An IC socket comprising:

a rectangular base member;

a plurality of insulating ribs arranged at regular intervals on said base member along opposite sides thereof;

a plurality of contact pins, each contact pin being inserted between adjacent two insulating ribs of said plurality of insulating ribs; and guides, each guide being mounted, in place of predetermined contact pins of said plurality of contact pins, to said base member, between a pair of opposite insulating ribs of said plurality of insulating ribs, for restricting a position where an IC package is mounted on said base member.

4. An IC socket according to claim 3, wherein each of said guides is shaped into a plate-like form.

5. An IC socket according to claims 3 or 4, wherein the number of said guides is at least one.

6. An IC socket comprising:

a rectangular base member;

a plurality of insulating ribs arranged at regular intervals on said base member along four sides thereof;

a plurality of contact pins, each contact pin being inserted between adjacent two insulating ribs of said plurality of insulating ribs;

guide members attached to said base member at corners of the four sides, for restricting positions of corner portions of an IC package of a predetermined size to be mounted on said base member; and at least one pair of guides mounted, in place of predetermined contact pins of said plurality of contact pins, to said base member, between insulating ribs of said plurality of insulating ribs arranged along sides adjacent to at least one pair of guide members of said guide members, for restricting a position where an IC package smaller than the IC package of the predetermined size is mounted on said base member.

7. An IC package according to claim 6, wherein said guide members are equipped with vertical face portions for guiding leads of the IC package when the IC package is mounted on said base member, and a height of each of the vertical face portions is selected above a height from a mounting face of said base member with which each of said plurality of contact pins comes in contact to an upper face of each of the leads of the IC package mounted on said plurality of contact pins.

8. An IC package according to claim 6, wherein said guides are equipped with vertical face portions for guiding leads of the IC package when the IC package is mounted on said base member, and a height of each of the vertical face portions is selected above a height from a mounting face of said base member with which each of said plurality of contact pins comes in contact to an upper face of each of the leads of the IC package mounted on said plurality of contact pins.

9. An IC package according to claims 7 or 8, wherein said vertical face portions are configured, at most, two for each of said guides, opposite to sides along which said plurality of contact pins are arranged.

10. An IC package comprising:

a rectangular base member;

a rectangular floating member mounted on said base member to be movable in a vertical direction thereof, having a plurality of contact-pin inserting holes bored at regular intervals in arrangements along four sides of said base member;

a plurality of contact pins implanted in said base member, having contact portions inserted in the contact-pin inserting holes; and at least one pair of guides removably fitted, in place of predetermined contact pins of said plurality of contact pins, into the contact-pin inserting holes, for restricting corner portions of an IC package to be mounted on said floating member.

11. An IC socket according to claims 6 or 10, wherein each of said guides has a cavity of such a shape that tile cavity can be engaged with a corner portion of the IC package.

12. An IC socket according to claims 6 or 10 wherein said guides are equipped with vertical face portions for guiding leads of the IC package when the IC package is mounted on said floating member, and a height of each of the vertical face portions is greater than above a height from a mounting face of said base member with which each of said plurality of contact pins comes in contact to an upper face of each of the leads of the IC package mounted on said plurality of contact pins.

13. An IC socket according to claim 12, wherein said vertical face portions are configured, at most, two for each of said guides, opposite to sides along which said plurality of contact pins are arranged.

* * * * *